TRANSISTOR BLOCKING OSCILLATOR USING RESONANT PULSE WIDTH CONTROL

Filed April 23, 1959 2 Sheets-Sheet 1

INVENTORS
MARTIN FISCHMAN
WILLIAM GELLER
BY Harry [signature]
ATTORNEY

INVENTORS
MARTIN FISCHMAN
WILLIAM GELLER
BY Harry Tunick
ATTORNEY

United States Patent Office 3,038,128

Patented June 5, 1962

3,038,128

TRANSISTOR BLOCKING OSCILLATOR USING RESONANT PULSE WIDTH CONTROL

Martin Fischman, Wantagh, and William Geller, Plainview, N.Y., assignors to Sylvania Electric Products Inc., a corporation of Delaware Filed Apr. 23, 1959, Ser. No. 808,394

4 Claims. (Cl. 331—112)

Our present invention relates to transistorized blocking oscillators.

Wave pulses, produced by blocking oscillators, are substantially rectangular in form, rising sharply to a maximum value, remaining at that value for a time duration known as "pulse width" or "on" time, and then sharply dropping to a zero or an "off" value. In the case of conventional transistorized blocking oscillators, the "on time" or pulse width varies over a wide range depending upon, for example, transistor characteristics, circuit loading, operating voltages, etc. This variation, which may run as high as 1,000 percent or 10 to 1, is highly undesirable and objectionable in many circuits and techniques using waveforms of pulse type.

An object of our present invention is, therefore, to provide a transistorized blocking oscillator in which the pulse width is substantially constant over a wide range of working conditions and well within acceptable tolerances. With our invention, pulse width variation is reduced to the order of magnitude of 10 percent which is acceptable for most practical working purposes.

Briefly, in accordance with our invention, a control current, preferably the base current of a transistorized blocking oscillator, is resonated in a series tuned circuit having inductance and capacity. The frequency of tuning is adjusted so that the time of one half cycle is made substantially equal to the desired pulse width of the pulses generated by the blocking oscillator. The arrangement is such that the base current oscillates for only one half cycle of the resonant frequency of the series circuit. The half cycle of resonated base current starts to increase from its zero value, when the pulse turns "on." At the end of the half cycle of the resonated base current where the base current falls to zero, the generated pulse is abruptly turned off. Since the "on" period of the pulses is determined by the intercepts of the curve of base current with a zero axis as fixed by the tuning of the series resonant circuit, the pulse width is constant and independent of the amplitude of the base current.

Our invention now will be described in greater detail with the aid of the accompanying drawing, wherein.

Figure 1A:
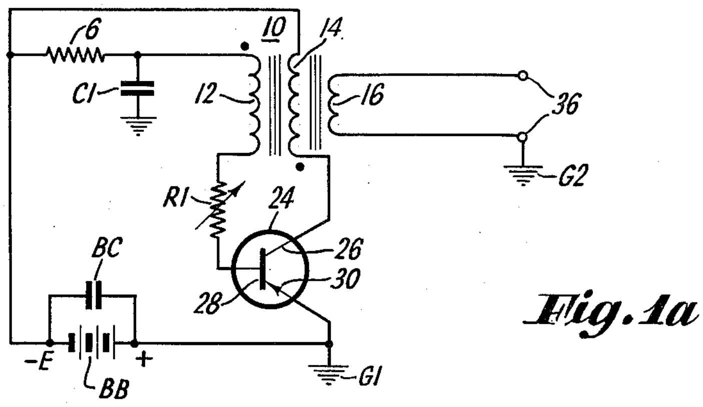
FIGURE 1A is a wiring diagram of a typical conventional transistorized pulse oscillator in which the pulse width of oscillations generated varies to an undesirable degree.

A typical conventional, transistorized blocking oscillator, such as shown in FIGURE 1A, generates pulses subject to wide variations in pulse width. The pulse width or "on time" is illustrated at $T_1$ in FIGURE 4B and the "off" time is illustrated in that figure at $T_2$. The sum of the "on" and "off" times, namely $T_1$ and $T_2$ is equal to the time T of one pulse cycle. The pulse width or time duration $T_1$ of pulses generated with the conventional type of blocking oscillator such as shown in FIGURE 1A, varies with circuit components and operating conditions and may change by as much as 10 to 1.

Specifically, the conventional transistorized blocking oscillator of FIGURE 1A makes use of a transistor 24 having an emitter 30, a base 28 and a collector 26. The transistor is illustrated as being of the PNP type. Collector voltage is applied from battery BB, by-passed by the by pass condenser BC, through the primary winding 14 of the feed back transformer 10. The emitter 30 of the transistor 24 is grounded at $G_1$.

The base 28 of the transistor 24 is subjected to a suitable operating voltage by the action of voltage dropping resistor 6 which is relatively high in value and limits base current flow. Also in circuit with the base, is the pulse width controlling resistor $R_1$ and the secondary winding 12 closely coupled to the primary winding 14 of transformer 10. Output pulses are taken from the generator by way of winding 16 closely coupled to the transformer windings 14 and 12. Winding 16 is connected to the output terminals 36, one of which, as shown, may be grounded at $G_1$, as are also emitter 30, and the positive terminal of voltage source BB. Condenser $C_1$ is of relatively large value.

In the operation of the conventional blocking oscillator shown in FIGURE 1A, transformer 10 provides regenerative feed back from the collector 26 to the base 28 when current flows in the emitter-collector circuit of the transistor. In other words, changes in current flow through the primary winding 14 induce changes in voltages across the secondary winding 12. These changes in voltage across secondary winding 12 affect current flow in the emitter-base circuit. The magnitude of the feed back and the gain of the transistor are sufficient to cause the transistor collector current to build up so that, in a very short time, operation will be in the saturation region of the transistor characteristic.

Figure 1B:
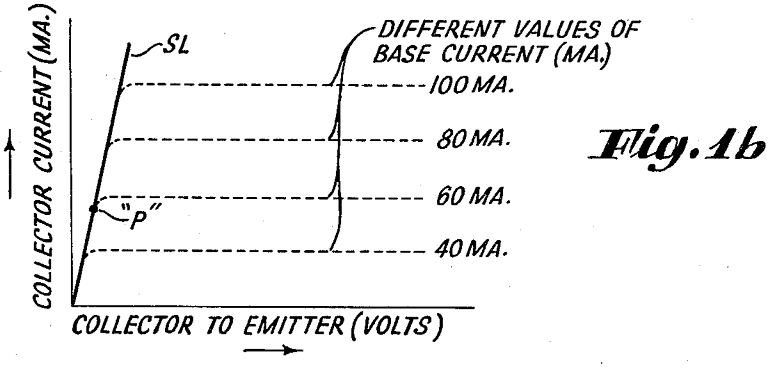
FIGURE 1B is an illustration of characteristic curves of a transistor.

In this saturation region, as shown by the solid line SL in FIGURE 1B, the collector current, determined by collector voltage, is independent of the base current. For example, consider an operating point such as point "P" of FIGURE 1B. It will be noted that the collector current at this operating point remains the same regardless of the value of base current above that point. Thus, as illustrated, the collector current at point P is the same regardless of whether the base current is 60 milliamperes, 80 ma., 100 ma., etc.

When saturation is reached, the transistor voltages remain, for practical purposes, in a state of equilibrium for an interval of time. This is due to the lack of dynamic action which exists in this condition of operation or equilibrium. The voltage equilibrium state corresponds to the turned on period or pulse width interval of the blocking oscillator, and will continue until the transistor operating point moves out of the saturation region into a region of high dynamic gain. When this occurs, the regenerative process starts and results in the rapid turning off of the transistor. The termination of the equilibrium condition may come about as a result of an increasing collector current, a decreasing base current or a combination of both, depending upon the value of capacitance of condenser $C_1$ and the inductance of the primary winding 14 of transformer 10.

With this conventional type of oscillator, the pulse width $T_1$ (see FIG. 4) will be influenced by transistor characteristics, circuit loading and operating voltages as a result of which the pulse width will vary undesirably by as much as 10 to 1.

Figure 2:
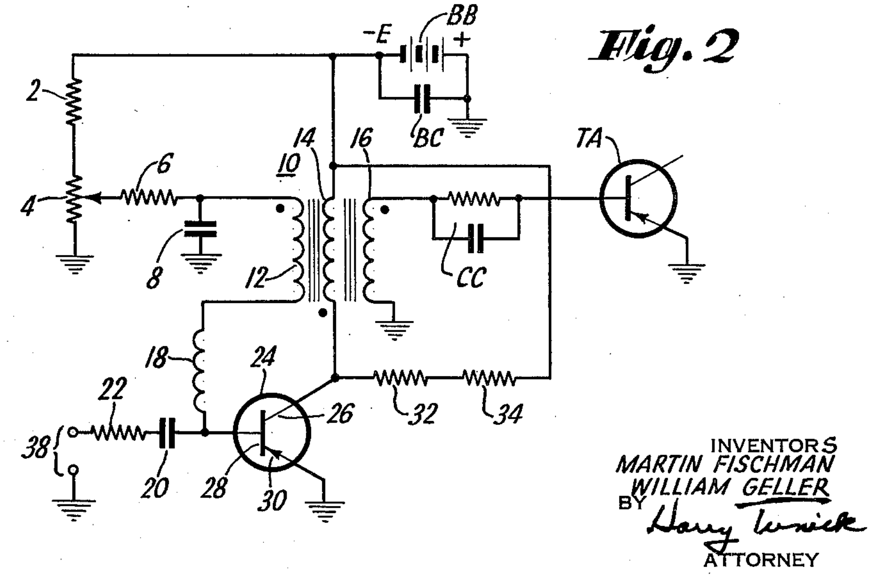
FIGURE 2 is a wiring diagram of a substantially constant pulse width, transistorized blocking oscillator according to our present invention.

In the transistor blocking oscillator of our invention illustrated by way of example in FIGURE 2, the pulse width, of the oscillations generated, is relatively constant despite changes in values of circuit components and circuit operating conditions. The pulse width, in accordance with our invention is controlled and stabilized by a series resonant system, having inductance and capacity, the current in which oscillates at the resonant frequency for a half cycle during each pulse cycle. The current in this series resonant system is a control current of the oscillator as it is the current flowing in the base circuit of the transistor. The pulse width, in accordance with our present invention, is determined by the zero current intercepts of the resonated base current or waveform with a zero axis. Hence, the pulse width is as stable as the series resonant system of our blocking oscillator. As compared with the pulse variation of as much as 1,000 percent encountered with conventional transistorized blocking oscillators such as shown in FIGURE 1A, the pulse width variation, of pulses generated, in accordance with our invention, is kept down to a variation of the order of 10 percent which is highly acceptable for most practical purposes.

More specifically, the constant pulse width transistor blocking oscillator of our invention, as illustrated in FIG. 2, makes use of a transistor 24, here shown as of the PNP type, having an emitter 30; base 28, and a collector 26. Obviously, a NPN transistor type may be used with, of course, a reversal in power supply voltage. The secondary winding 12 of transistor 10 is closely coupled to the primary winding 14 so that collector current flowing in the latter induces voltages across coil 12 which are effective in the base circuit of the transistor to change base current flow. Output pulses are taken from winding 16 coupled to the windings 12, 14 of transformer 10, output terminals 36 being provided to facilitate connection of an output circuit to the winding 16.

Power and operating biases are supplied by a suitable power supply source, here illustrated as a battery BB shunted by a by-passing condenser BC. The positive terminal of battery BB is connected to ground and the negative terminal of battery BB is connected to the collector 26 by way of primary winding 14. Negative voltage from the source BB is applied to the base 28 by way of voltage dropping resistors 2, 4 and 6. Resistor 6 is in series with the base electrode and as illustrated is variably tapped to resistor 4.

Resistors 32, 34 in shunt to the primary winding 14, provide means for varying the repetition rate of the oscillator without materially changing pulse width. Also this repetition rate may be varied by changing the voltage E of the power supply source. The output terminals 36 are connected, as shown to a following transistor amplifier TA through the condenser-resistor coupling circuit CC. This output circuit, including coupling circuit CC and the amplifier TA, avoids undesirable retriggering which tends to occur, after trailing edges of the pulses.

The pulse width is controlled and stablilized by the action of the series resonant system consisting of capacitor 8, which may be made variable, and a coil or inductor 18 which also may be made variable. The tuning of the series resonant system consisting of condenser 8 having a value of capacity $C_1$ and inductor 18 having a value of inductance $L_1$, will control and stabilize the width of pulses generated by the blocking oscillator of FIG. 2. The pulse width will be, effectively, one half cycle of the frequency to which the series resonant system, comprising condenser 8 and coil 18, are tuned.

In other words, in our system as illustrated in FIG. 2, pulse width control and stablization are accomplished by the series resonant circuit 8, 18 which freely oscillates for a half cycle as illustrated in FIGS. 3B and 4A, during each pulse cycle of duration T. The pulse width produced is determined by the zero current intercepts of the base current waveforms with the zero axis as shown in FIG. 3B. It should be noted that the series resonant system may use, for the required inductance, the leakage inductance of transformer 10 as reflected into the base winding 12. This is accomplished by loosening the coupling of secondary 12 with respect to primary winding 14.

Figure 3:
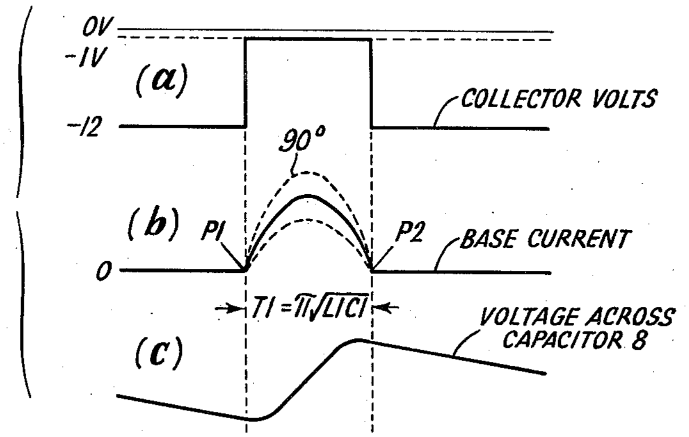
FIGURE 3 is an illustration of current forms used in the explanation of our invention as shown in FIGURE 2.

As already indicated, idealized waveforms, illustrating the operation of our constant width pulse generator, are given in FIG. 3. Upon triggering of the oscillator, a sine wave of current starts to flow in the base circuit starting at zero current or as indicated in FIG. 3B at the left hand intercept point $P_1$. This base current increases from zero, goes through a maximum at 90 degrees and finally diminishes to zero at point $P_2$ or at 180 degrees. At the intercept point $P_2$, since the base drive is reduced to zero, the oscillator is turned off. Maximum energy is stored in the coil 18 or leakage inductance at 90 degrees. At 180 degrees, all of the energy is stored in the capacitor 8. The oscillator circuit remains quiescent until the charge on condenser 8 is removed and the next triggering impulse is applied. It should be noted that the charge on condenser 8 back biases the transistor to cut off. The charge on this condenser, which back biases the transistor, however, leaks off through resistor 6, as shown in FIG. 3C for an interval of time $T_2$, as shown in FIG. 4B.

Figure 4:
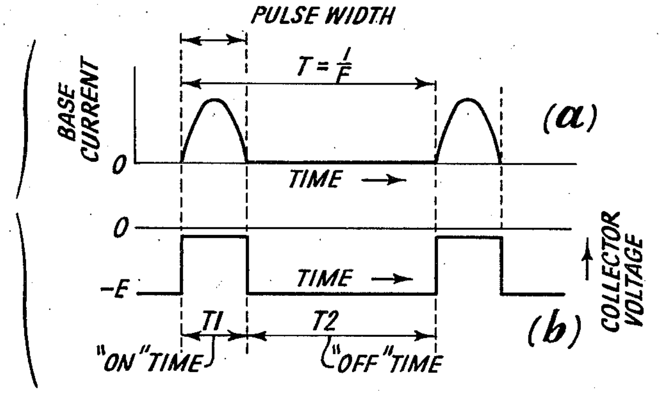
FIGURE 4 illustrates curves useful in the further understanding of our present invention.

FIGURES 3B and 4A show that the critical crossing or intercept of the base current waveform with the zero axis occurs at a time T equal to $\pi\sqrt{LC}$ where L is the inductance of the series resonant system and C the capacitance thereof. Also, as illustrated in FIGURES 3 and 4, the time T or the pulse width of the generated pulses, is independent of the amplitude of the base current and depends only upon the inductive and capacitive reactances of the series tuned circuit; namely the time of a half cycle of the frequency to which the series resonant circuit is tuned. Thus, we have provided a pulse oscillator in which the pulse width of the pulses generated is extremely constant and stable being dependent solely on the inductance and capacity of the series resonant system and is substantially independent of changes in power supply voltage, transistor characteristics, and circuit loading.

In the circuit of our invention, also, by changing the values of condenser 8 or inductor 18 or both, pulses of desired width are generated. In other words, changes in tuning of the series resonant system, changes the time of a half cycle of the series circuit and, hence, the pulse width.

It should be noted that in the circuit of FIGURE 2, the inductance of the series resonant system may be varied without affecting, to any great extent, the repetition rate of the pulse generator. The repetition rate, fixed by the sum of the "on" and "off" times or $T_1$ plus $T_2$ (see FIGURE 4B) may be varied, without affecting to any great extent, the pulse width, by changing the voltage of the power supply, or the value of resistor 6 or the value of the shunting resistors 32, 34.

If desired, as illustrated in FIGURE 2, synchronizing pulses may be fed into the pulse generating system at terminals 38 through resistor 22 and coupling condenser 20. These synchronizing pulses will maintain constant the frequency of the pulses generated. By way of explanation, referring to FIGURE 4A, the synchronizing pulses will serve to maintain constant, the time T which represents the time of one cycle of the pulses generated by the blocking oscillator.

Figure 5:
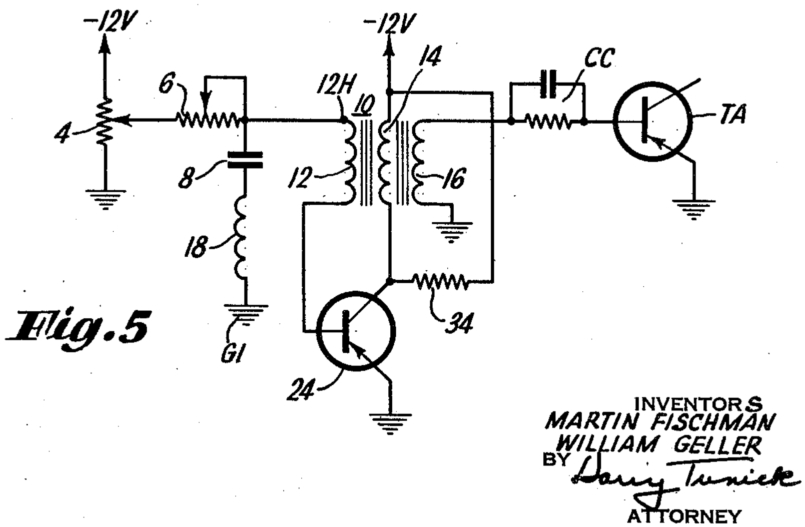
FIGURE 5 is a wiring diagram of another form of our invention for producing, by means of a transistor and associated circuits, pulses of substantially constant width.

Another embodiment of our constant pulse width transistor blocking oscillator is shown in FIGURE 5. As before, transistor 24 is provided with a transformer 10 which regeneratively couples the collector and base circuits thereof, the repetition rate being controlled by adjustment of resistors 6 and 34 and also by changing the value of the applied voltage, here shown by way of example, as having a value of 12 volts.

In the arrangement of FIGURE 5, however, the series resonant circuit consisting of condenser 8 and coil 18 is shown as being connected externally of the secondary coil 12, rather than directly in series with coil 12, as shown in FIGURE 2. More specifically, the series resonant circuit 8, 18 of FIGURE 5, is connected between ground $G_1$, as illustrated, and the high alternating potential side 12H of the secondary winding 12.

We have set up and successfully operated the circuit of FIGURE 2 using the following values for the electrical components which however, are only suggestive and are not to be construed in any way as limiting our invention.

| | |
|---|---|
| Transistor 24 | Type 2N247 drift transistor. |
| Resistor 2 | 68 ohms. |
| Resistor 4 | 500 ohms. |
| Resistor 6 | 180 ohms. |
| Condenser 8 | 0.05 mf. |
| $E$=—12 volts | |
| Primary winding 14 | 120 turns. |
| Secondary winding 12 | 30 turns. |
| Output winding 16 | 60 turns. |
| Resistor 32 | 68 ohms. |
| Resistor 22 | 560 ohms. |
| Condenser 20 | 2,200 mmf. |

Similarly, the following values for the components of FIGURE 5 are suggested as workable values. Other values may, of course, be used without departing from the spirit and scope of our invention.

| | |
|---|---|
| Resistor 6 | 2,500 ohms. |
| Condenser 8 | 0.05 mf. |
| Coil 18 | 160 mh. |
| Coil 14 | 100 turns. |
| Coil 12 | 25 turns. |
| Coil 16 | 50 turns. |
| Resistor 34 | 1200 ohms. |
| Transistor 24 | Type 2N317. |

We claim as our invention:

1. A pulse generator generating pulses of substantially constant width comprising a transistor having a base, an emitter and a collector; a transformer having a primary winding and a secondary winding, said transformer having a leakage inductance reflected into its secondary winding; a source of potential, the primary winding being connected between one terminal of said source and the collector, the other terminal of said source and said emitter being grounded; a resistor, said resistor and said secondary winding being connected in series with said source and said base; and a condenser connected between said resistor and ground, the capacitive value of said condenser and the leakage inductance reflected into the secondary winding of the transformer being such as to resonate at a frequency such that one half cycle thereof corresponds to a desired pulse width.

2. A pulse generator generating pulses of substantially constant width comprising a transistor having a base, an emitter and a collector; a transformer having a primary winding and a secondary winding; a source of potential, the primary winding being connected between one terminal of said source and the collector, the other terminal of said source and said emitter being grounded; a resistor, an inductance coil, said resistor, said inductance coil and said secondary winding being connected in series with said source and said base; and a condenser connected between said resistor and ground, said condenser and inductance coil being of such value as to series resonate the base circuit at a frequency such that one half cycle thereof corresponds to a desired pulse width.

3. A blocking oscillator for generating voltage pulses comprising a transistor having first, second and third electrodes; a transformer having first and second windings; output circuit means including the first winding of said transformer coupled between the first and third electrodes of said transistor, and a series circuit coupled between the first and second electrodes of said transistor, said series circuit including the second winding of said transformer and a series resonant circuit, said series resonant circuit having a resonant frequency corresponding to the desired width of said pulses.

4. A blocking oscillator as defined in claim 3 wherein the first, second, and third electrodes of said transistor comprise the emitter, base, and collector respectively and said series resonant circuit includes a condenser and an inductor.

References Cited in the file of this patent

UNITED STATES PATENTS

| | | |
|---|---|---|
| 2,227,075 | Geiger | Dec. 30, 1940 |
| 2,438,845 | Dodds et al. | Mar. 30, 1948 |
| 2,493,044 | Thorne | Jan. 3, 1950 |
| 2,605,407 | Perkins | July 29, 1952 |
| 2,841,700 | Hallden | July 1, 1958 |
| 2,902,655 | Jones et al. | Sept. 1, 1959 |